United States Patent
Criminale et al.

(10) Patent No.: US 11,361,948 B2
(45) Date of Patent: Jun. 14, 2022

(54) TEMPERATURE MEASUREMENT FOR SUBSTRATE CARRIER USING A HEATER ELEMENT ARRAY

(71) Applicant: Applied Materials, Inc., Santa Clara, CA (US)

(72) Inventors: Phillip Criminale, Livermore, CA (US); Zhiqiang Guo, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 415 days.

(21) Appl. No.: 16/440,632

(22) Filed: Jun. 13, 2019

(65) Prior Publication Data

US 2019/0295824 A1 Sep. 26, 2019

Related U.S. Application Data

(63) Continuation of application No. 15/241,379, filed on Aug. 19, 2016, now Pat. No. 10,366,867.

(51) Int. Cl.
*H01J 37/32* (2006.01)
*H05B 3/06* (2006.01)
(Continued)

(52) U.S. Cl.
CPC .. *H01J 37/32724* (2013.01); *H01J 37/32715* (2013.01); *H01J 37/32935* (2013.01);
(Continued)

(58) Field of Classification Search
CPC ......... H01L 21/67103; H01L 21/67248; H01L 21/67069; H01L 22/20; H01J 37/32724;
(Continued)

(56) References Cited

U.S. PATENT DOCUMENTS

| 5,521,850 A | * | 5/1996 | Moe .................. B29C 45/2737 |
| | | | 219/505 |
| 7,075,031 B2 | | 7/2006 | Strang et al. |

(Continued)

FOREIGN PATENT DOCUMENTS

| JP | 2014/522565 | 9/2014 |
| JP | 2014/525664 | 9/2014 |

(Continued)

OTHER PUBLICATIONS

Official Letter from Taiwan Patent Application No. 106127535 dated Jan. 20, 2021, 14 pgs.
(Continued)

*Primary Examiner* — Brian W Jennison
(74) *Attorney, Agent, or Firm* — Schwabe, Williamson & Wyatt, P.C.

(57) ABSTRACT

Temperature measurement is described for a substrate carrier using a heater element array. In one example a method includes measuring a first combined current load of each of a plurality of heating elements in the electrostatic chuck, changing a power status of a first heating element of the plurality of heating elements, measuring a second combined current load of each of the plurality of heating elements after changing the power status of the first heating element, determining the difference between the first and second combined current loads, determining a temperature of the first heating element using the difference, and reverting the power status of the first heating element to that before the change and repeating changing power, measuring a current load, determining a difference, and determining a temperature for each of the other heating elements of the plurality to determine a temperature at each of the heating elements of the plurality.

14 Claims, 8 Drawing Sheets

(51) Int. Cl.
    *H01L 21/67*     (2006.01)
    *H01L 21/66*     (2006.01)

(52) U.S. Cl.
    CPC .. *H01L 21/67069* (2013.01); *H01L 21/67103* (2013.01); *H01L 21/67248* (2013.01); *H01L 22/20* (2013.01); *H01J 2237/3321* (2013.01)

(58) Field of Classification Search
    CPC .......... H01J 37/32715; H01J 37/32935; H01J 2239/3321; H05B 3/06
    See application file for complete search history.

(56) References Cited

U.S. PATENT DOCUMENTS

| | | | |
|---|---|---|---|
| 7,224,256 | B2 | 5/2007 | Parsons |
| 9,307,578 | B2 | 4/2016 | Pease |
| 2004/0081439 | A1 | 4/2004 | Kholodenko et al. |
| 2009/0248349 | A1* | 10/2009 | Hasson ............. B01L 3/502715 702/133 |
| 2012/0292305 | A1 | 11/2012 | Ambal et al. |
| 2012/0293205 | A1* | 11/2012 | Kowal .................. G06F 9/3869 326/93 |
| 2014/0048529 | A1 | 2/2014 | Pease |
| 2014/0263274 | A1 | 9/2014 | Singh |
| 2015/0219499 | A1 | 8/2015 | Waldmann et al. |
| 2015/0226611 | A1 | 8/2015 | Busche et al. |
| 2016/0149733 | A1 | 5/2016 | Criminale et al. |
| 2016/0198524 | A1 | 7/2016 | Pease et al. |
| 2016/0205725 | A1* | 7/2016 | Pease .................. H05B 1/0202 219/448.12 |
| 2016/0370788 | A1 | 12/2016 | Bailey, III et al. |
| 2016/0370795 | A1 | 12/2016 | Musselman et al. |
| 2016/0370796 | A1 | 12/2016 | Musselman et al. |
| 2016/0372352 | A1 | 12/2016 | Wu et al. |
| 2016/0372355 | A1 | 12/2016 | Zhang et al. |
| 2020/0027706 | A1 | 1/2020 | Jing |

FOREIGN PATENT DOCUMENTS

| | | |
|---|---|---|
| JP | 2014-529847 | 11/2014 |
| TW | 2015/261 54 | 7/2015 |
| WO | WO 2015/119734 | 8/2015 |

OTHER PUBLICATIONS

Non-Final Office Action from U.S. Appl. No. 15/241,379 dated Sep. 19, 2019, 20 pgs.
Notice of Reasons for Rejection from Japanese Patent Application No. 2019-509506 dated Apr. 26, 2021, 11 pgs.
Preliminary Rejection from Korean Patent Application No. (PCT) 10-2019-7007573 dated Jul. 15, 2020, 8 pgs.
Notice of Reasons for Rejection from Japanese Patent Application No. 2019-509506 dated Jun. 29, 2020, 12 pgs.
Notice to File a Response ("preliminary rejection") from Korean Patent Application No. 10-2021-7007610 dated Jun. 21, 2021, 4 pgs.
International Search Report and Written Opinion from PCT/US2017/045989 dated Nov. 17, 2017, 12 pages.
International Preliminary Report on Patentability from PCT/US2017/045989 dated Feb. 28, 2019, 9 pgs.

* cited by examiner

TEMPERATURE MEASUREMENT FOR SUBSTRATE CARRIER USING A HEATER ELEMENT ARRAY

CROSS-REFERENCE TO RELATED APPLICATIONS

This application is a continuation of U.S. patent application Ser. No. 15/241,379, filed on Aug. 19, 2016, the entire contents of which are hereby incorporated by reference herein.

FIELD

The present description relates to the field of semiconductor and micromechanical substrate processing using a substrate carrier in a chamber and, in particular, measuring the temperature of the substrate carrier using an array of heater elements.

BACKGROUND

Semiconductor and micromechanical systems are formed on substrates, such as silicon wafers. A complex sequence of operations involving depositing, etching, shaping, patterning and washing are applied to the substrate to form the tiny structures that form the semiconductor and micromechanical parts on the substrate. These structures are made smaller and closer together in order to reduce cost. The smaller structures require less material, less power to operate, and less space to house. The smaller structures are also often faster than larger structures and may have many more advantages.

In order to make smaller structures, the fabrication processes must be more precise. Every aspect of the process is improved over time to enable smaller structures. Many of the fabrication processes, such as electron beam deposition, plasma deposition, plasma-enhanced chemical vapor deposition (PECVD), resist stripping, and plasma etching, etc. are affected by the temperature of the silicon wafer. If the temperature of the wafer in one location is different from that in another location, then the result of the process will be different in the different locations. In addition, if the temperature is different from the temperature for which the process was designed, then the results of the process will not be what was designed. As a result, temperature variations during fabrication may cause some structures to work poorly or even be inoperable.

The temperature of a substrate in a processing chamber can be measured using an infrared camera or a heat sensor on the substrate. In some cases a special wafer is used that has one or more thermal sensors and that store temperatures in a memory during a test process. A process is performed with the special wafer in the chamber and then the process is adjusted based on the measured temperatures.

SUMMARY

Temperature measurement is described for a substrate carrier using a heater element array. In one example a method includes measuring a first combined current load of each of a plurality of heating elements in the electrostatic chuck, changing a power status of a first heating element of the plurality of heating elements, measuring a second combined current load of each of the plurality of heating elements after changing the power status of the first heating element, determining the difference between the first and second combined current loads, determining a temperature of the first heating element using the difference, and reverting the power status of the first heating element to that before the change and repeating changing power, measuring a current load, determining a difference, and determining a temperature for each of the other heating elements of the plurality to determine a temperature at each of the heating elements of the plurality.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
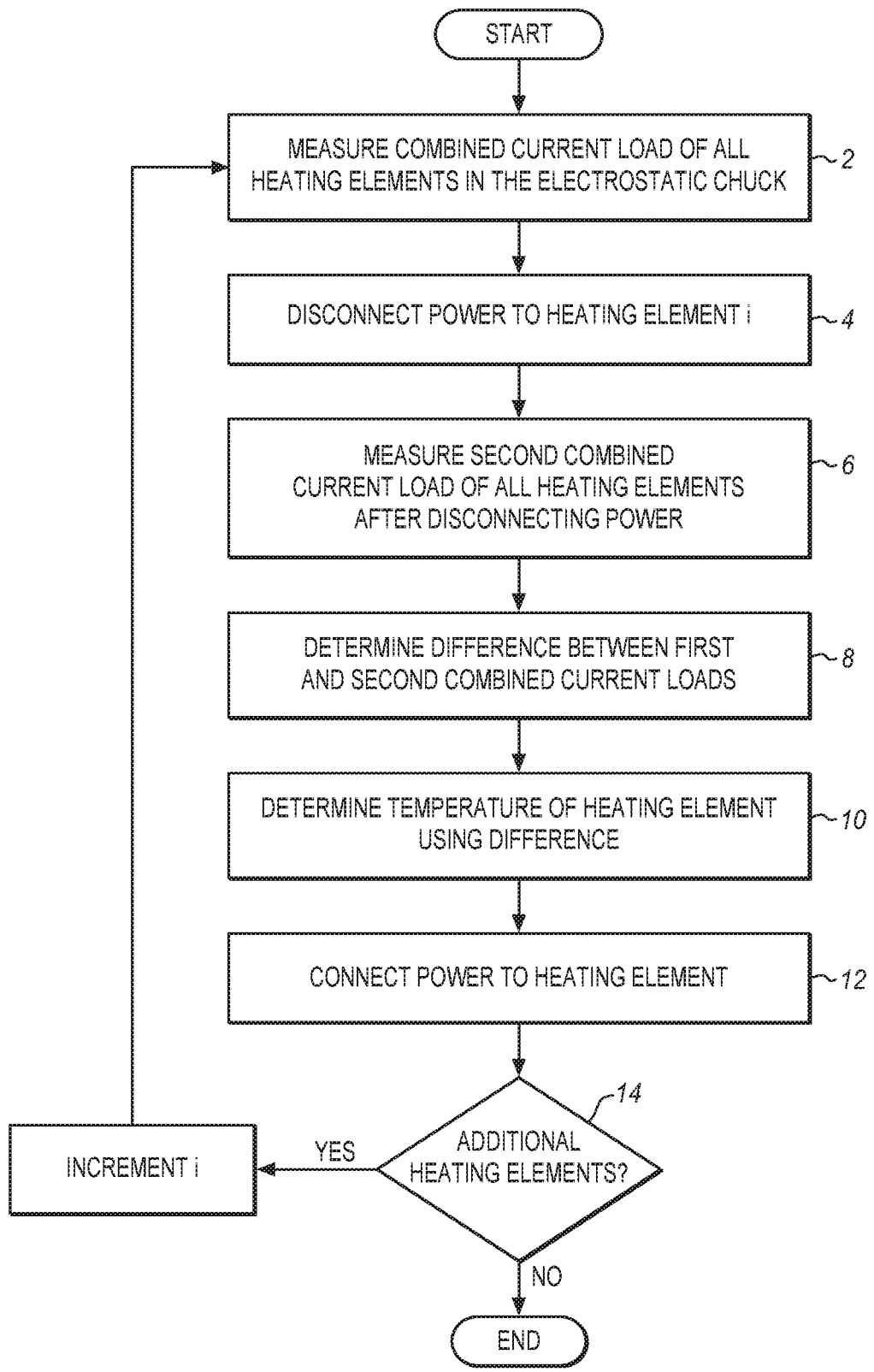
FIG. 1 is a process flow diagram of a subtractive approach to determining a temperature profile of a substrate attached to a substrate carrier according to an embodiment.

As described herein an array of heating elements in a support, carrier, pedestal, or chuck that carries a substrate in a processing chamber may be used to measure the temperature of the substrate support. The heating elements have a resistance that is related to temperature so that the resistance of a heating element can be measured as an indication of the temperature of the support. This provides an indication of the temperature of the substrate immediately above the support. The array of heater elements provides independent temperature measurements at different positions on the support. The different measurements allow temperature variations across the substrate to be measured. This allows for the heaters to be operated to even out the temperature or for the support to be modified to correct for the inconsistent temperatures.

In some cases, an electrostatic chuck (ESC) is fitted with an array of heater elements to allow for the temperature of the ESC to be adjusted differently at different positions across the surface of the ESC. While the present description is presented in the context of an ESC, the structures and techniques may also be applied to other types of substrate carriers. The array of heater elements may also be used as temperature sensors or thermal sensors. This allows for the temperature of the substrate to be determined. The corresponding heater element may then be activated or deactivated to accommodate the measured temperature.

The heater elements are wired to receive an electrical current and the heating elements by nature typically have a linear relationship of resistance to temperature. The heater elements that are often used in an ESC have a metallization material formulated of tungsten and alumina. This metalized material like many others responds to temperature with a linear relationship that can be used for measurement and control.

By using the heater elements, external temperature sensors are avoided, simplifying the ESC and the processing chamber. There may also be more accurate information on temperature variations across the substrate by measuring the temperature at many closely arrayed points.

The thermal sensor data from the heater elements can be used to feed open loop models or a time based closed loop control PID (Proportional-Integral-Derivative) scheme. The measurements may be taken inside and outside the RF (Radio Frequency) hot environment and may be implemented in many different ways in plasma etch and other processes. The thermal sensor may be used for open loop verification of the ESC and substrate temperature, for closed loop control of the ESC and substrate temperature, and for diagnostics of damaged heating arrays or cooling channel elements.

An alternative to the described approach is to place a thermal sensor near each heater element. In such a case, each heater element requires a pair of wires to control the rate at which it applies heat to the ESC. Each thermal sensor also requires a pair of wires to send temperature readings. The footprint for this system is larger to accommodate the wiring, the switching, the power distribution, and the control circuitry of the thermal probes or RTDs (Resistance Temperature Detector)

The larger footprint takes space which could be used for switching elements or other logic devices in the ESC. There would also be space in a control box to receive all the additional wires and track and maintain all of the temperature measurements. In addition to the space required, complicated I/O and mechanical interfaces to external processing devices are required. This additional cost and complexity might lead to designs that are constrained to fewer less accurate measurements in order to reduce cost.

The described techniques may be applied to wafers, pedestals, carriers, and electrostatic chucks with multiple heater zones. These may also include bulk heating zones. In some embodiments there are more than 150 mini resistive heaters that are used in the RF hot environment, but there may be 300 or more. This may all be accommodated with a 300 mm silicon wafer carrier. As described below, the control architecture may be scaled to support the hundreds of heating zones. This architecture provides real time control to devices both internally and externally of the RF hot environment, but does not require extra temperature measurement hardware.

To measure the temperature, the heating current to a particular heater element is turned off. A measurement current is then driven through the heater element. Sensor hardware may be used to measure the full current or a partial current going through the heater element. In some embodiments a PWM (Pulse Width Modulation) frequency may be used.

The relationship between the measured current and the temperature of the ESC can be accurately measured in several different ways. One way is by timing the activated array element and measuring the current and the voltage used by the element. Current or voltage or both may be measured by devices such as inline shunt resistors, current clamps, Hall Effect sensors, and voltage dividers. The signal can be digitized by analog to digital converters for later processing.

FIG. 1 is a process flow diagram of a subtractive approach to determining a temperature profile of a substrate attached to an electrostatic chuck or any other substrate carrier featuring heaters as described herein. At 2 a first combined current load is measured. This current load is the current consumed by all of the heating elements of the carrier or of a group of heating elements that are all powered with a single current supply. In this process, single heating elements or small groups of heating elements may be individually turned on or off.

At 4 the power is disconnected from one of the heating elements of the carrier. In this example, the heating elements have a common power supply but may individually be controlled or controlled in groups. Each heating element or group of heating elements may be switched off, de-powered, or disconnected in some other way so that the selected heating element is no longer consuming power and is no longer heating the carrier or the substrate that is being carried. This is referred to as element i, where i is a variable that is incremented through all of the heating elements that will be measured.

With the selected heating element disconnected the current load is measured again at 6. This provides a second combined current load for all heating elements after disconnecting power to the first selected heating element. At 8 the difference between the first and the second combined current loads is determined. This provides the current that was being consumed by the selected heating element or element i. At 10 the temperature of the selected heating element is determined.

The temperature of the heating element is directly related to its resistance. The resistance may be determined using the current and known voltage. If the voltage is not known then this may also be measured at the same time as the current load. The resistance has a linear relationship to the temperature of the heating element which is the same as the temperature of the carrier in the area of the heating element. The temperature of the heating element may then be related to the substrate that is being carried by using a model or a look up table based on empirical measurements. With the temperature at the heating element determined, the system may then move to reconnect power to the selected heating element at 12.

At 14 another heating element is selected. If the first element is designated as element 1, wherein i=1, then i is incremented and the next element is element 2, wherein i=2. After incrementing i or after simply selecting the next heating element, the process returns to 2 and the operations of disconnecting, measuring a current load, determining a difference, and temperature and reconnecting the heater element are repeated for each of the other heating elements of the to determine a temperature at each of the heating elements of the carrier.

After all of the heating element are measured then the process ends. In this process, the selection of heating elements may be ordered with an offset or spacing. Since a heating element is temporarily turned off to make the temperature measurement, the carrier will be slightly cooler in the area of that heating element. The next heating element to be measured may be spaced some distance from the last heating element so that the local cooling does not affect the next measurement. The carrier will have time to recover before another heating element in the same area is measured.

As mentioned above inside of measuring the temperature at each heating element, the heating elements may be grouped. In this case, the temperature will be averaged over the group of heating elements. As an example, the determined current, voltage, or resistance may be divided or distributed among the heating elements of the measured subset. This may be done simply by dividing by the number of heating elements or in another way. The temperature may then be determined using the divided resistance.

Figure 2:
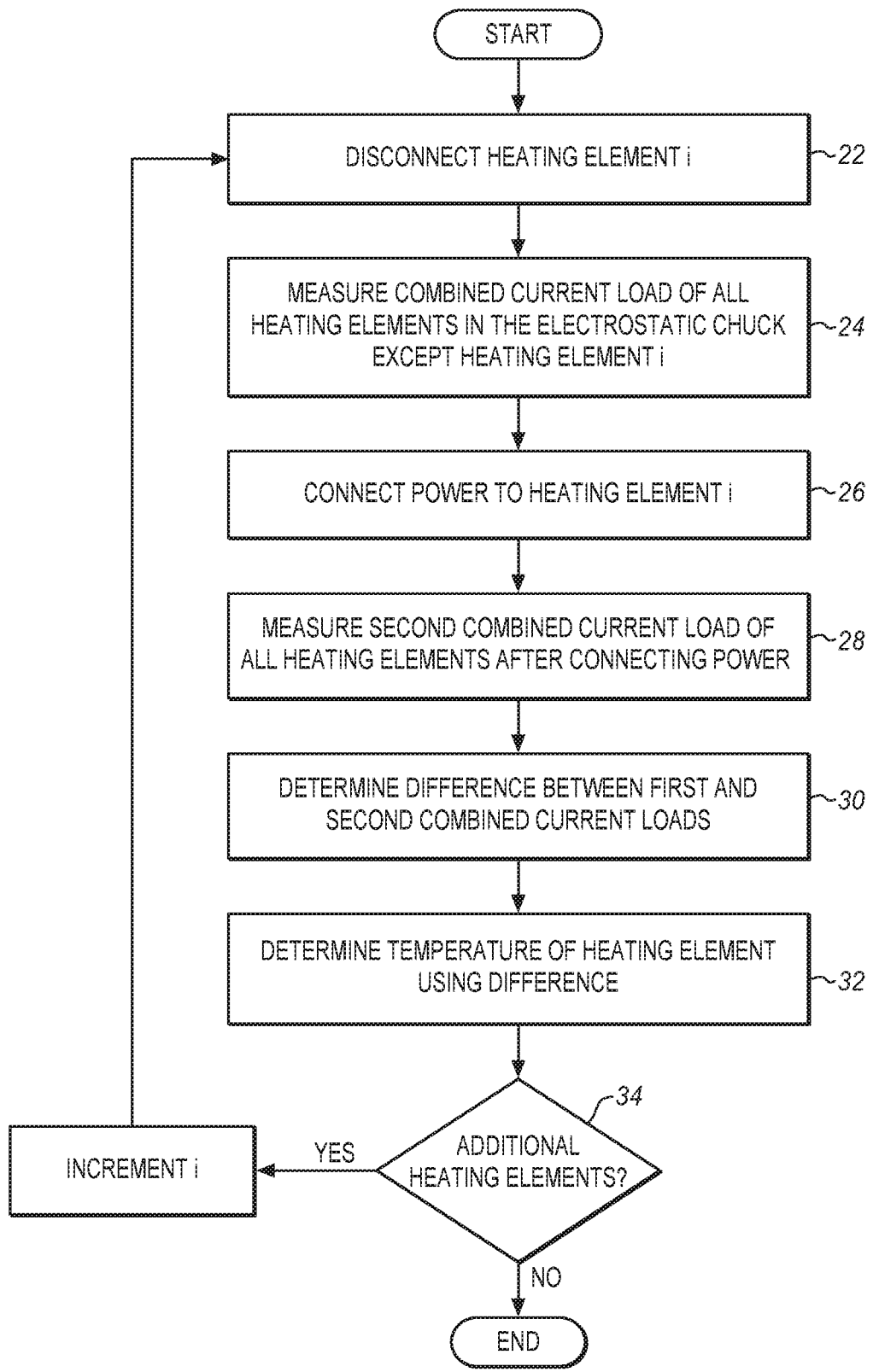
FIG. 2 is a process flow diagram of an additive approach to determining a temperature profile of a substrate attached to a substrate carrier according to an embodiment.

FIG. 2 is a process flow diagram of an additive approach to determining a temperature profile of a substrate attached to an electrostatic chuck or other substrate carrier with heaters. At 22 a first one of the heating elements is switched off, de-powered, or disconnected from using power in some way. At 24 a first combined current load is measured. This current load is the current consumed by all of the heating elements of the carrier or of a group of heating elements that are all powered with a single current supply excluding the heating element for which the temperature is to be measured. In this process, a single heating element or small group of heating elements turned off. Power is supplied to the other heating elements and this is what is measured. At 26 power is restored to the selected heating element i, and at 28 the current is measured again. As in the example of FIG. 1, the voltage may also be measured with the current or the voltage may be maintained at a constant depending on the particular power supply implementation.

At 30 the difference between the two measurements is determined. This isolates the power consumed by the selected heating element, i. At 32 this difference is used to determine a temperature of the heating element. The temperature is directly related to the resistance which may be determined using the current and the voltage difference. This temperature determination may then be stored in a log with a measurement time for use in modifying the process, detecting production variations, improving yield and other purposes.

At 34 the process ends if all of the heating elements have been measured or it returns to the beginning to go to the next heating element. This may be performed by incrementing i to represent the next heating element and then repeating the operations of disconnecting power, measuring the current, connecting the power, measuring the current again, determining a difference, and determining a temperature for each of the other heating elements.

Figure 3:
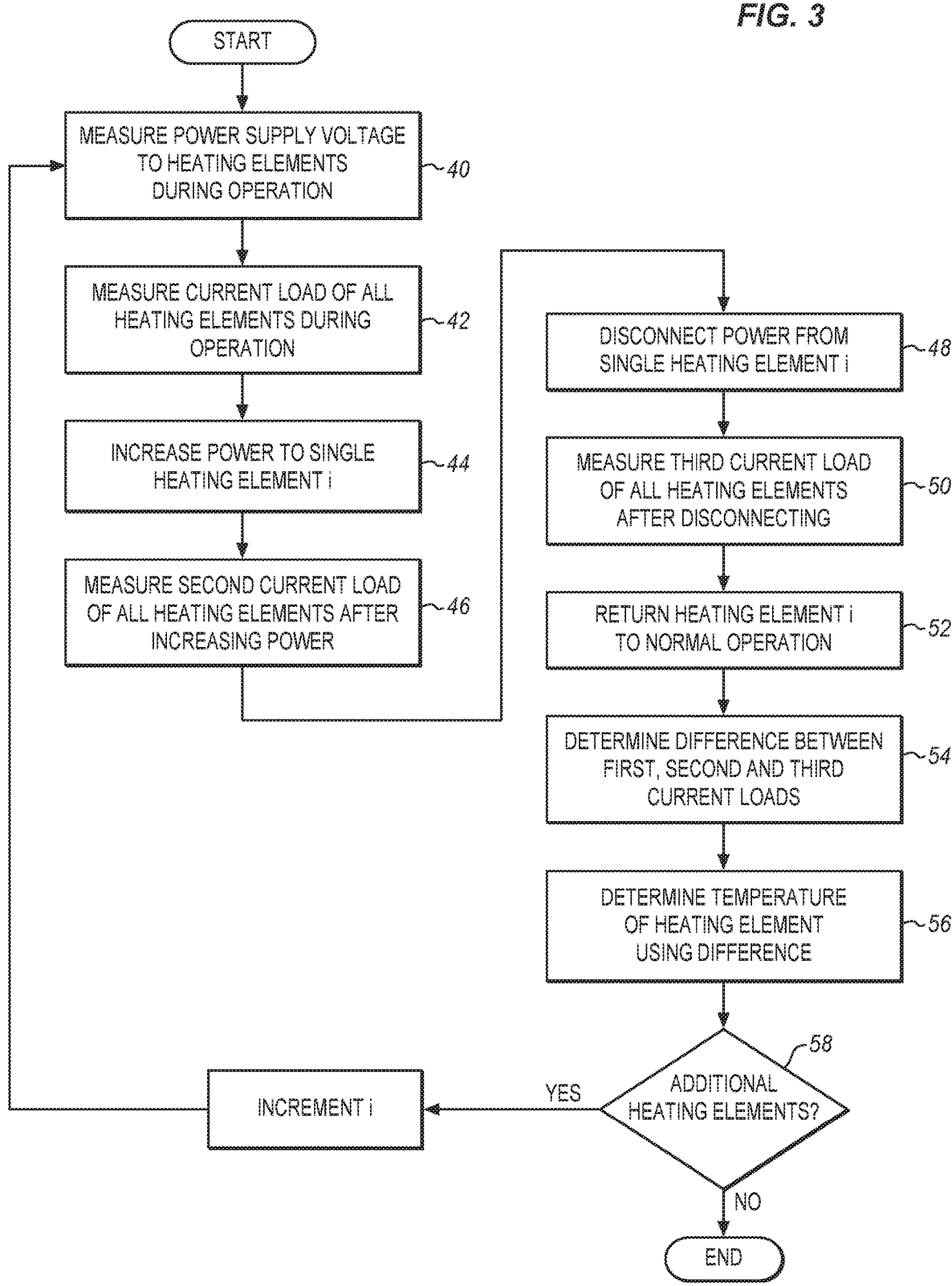
FIG. 3 is a process flow diagram of an additive and subtractive approach to determining a temperature profile of a substrate attached to a substrate carrier according to an embodiment.

FIG. 3 is a process flow diagram of an alternative additive and subtractive approach to determining a temperature profile of a substrate attached to an electrostatic chuck or any other substrate carrier featuring heaters as described herein. As above, this process is particularly well suited to use during a plasma process but may also be used in other circumstances. At 40 the voltage supplied to all of the resistive heating elements is measured. The measurement may be made at a central power supply that supplies all of the resistive heating elements together. If the heating elements are powered in smaller groups, e.g. four separate power supplies are each used for a separate one fourth of the heating elements, then this process may be applied separately to each group. This operation may also be applied to the first two processes described above.

At 42 a first combined current load is measured. This current load is the current consumed by all of the heating elements of the carrier or of a group of heating elements that are all powered with a single current supply. In this process, single heating elements or small groups of heating elements may be individually turned on or off. This process is performed while the heating elements are in normal operation. Accordingly, most of the heating elements will be in an intermediate power state as neither fully on nor fully off. In other words the current duty cycle will be at some intermediate value.

For the next operation a particular single one of the heating elements is selected as the start of the process. This element is designated e.g. as element 1 or element 0 and a variable i=0 to track the process through each element. At 44 the power is increased from the first heating element i=0. In some embodiments, the heating element goes to full ON or a 100% duty cycle. This ON states is required only long enough to measure the current. At 46, the current load of all of the heating elements is measured again after increasing the power. At 48 the power to the single heating element is then switched to OFF. The other heating elements of the carrier are not affected.

With the selected heating element disconnected at 48 the current load is measured again at 50. This provides a third combined current load for all heating elements after disconnecting power to the first selected heating element. The carrier may then be returned to normal operation and the temperature of the carrier may be stabilized at 52.

At 56 the differences between the first, second and third combined current loads are determined. This provides the current that was being consumed by the selected heating element or element i. At 56 the temperature of the selected heating element is determined using these differences.

At 58 another heating element is selected. If the first element is designated as element 1, wherein i=1, then i is incremented and the next element is element 2, wherein i=2. After incrementing i or after simply selecting the next heating element, the process returns to 40 or to 42 if the voltage is fixed and the operations are repeated at each of the heating elements of the carrier. After all of the heating element are measured then the process ends.

Figure 4:
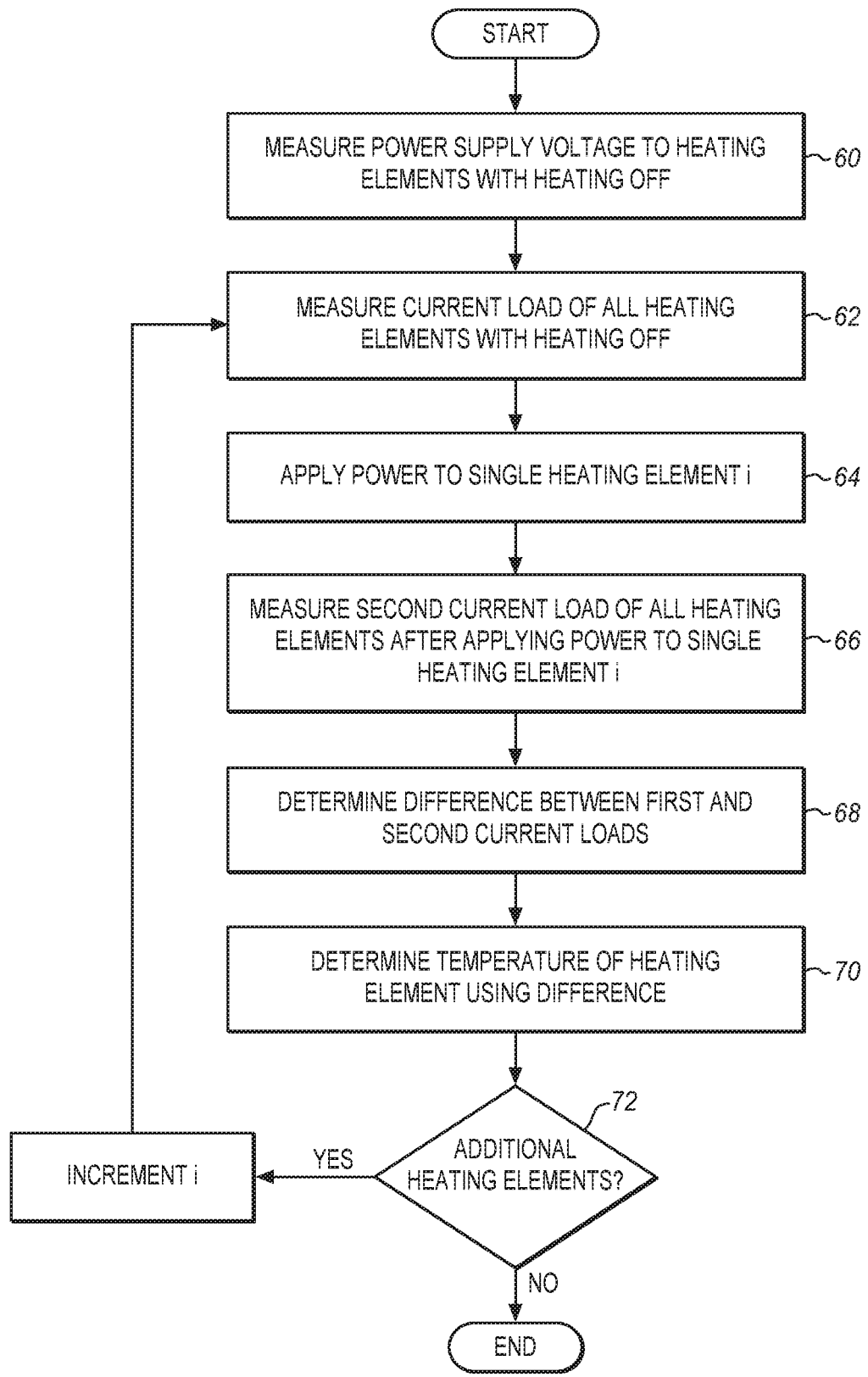
FIG. 4 is a process flow diagram of a passive carrier approach to determining a temperature profile of a substrate attached to a substrate carrier according to an embodiment.

FIG. 4 is a process flow diagram of an alternative approach to determining a temperature profile of a substrate attached to a passive electrostatic chuck or any other substrate carrier featuring heaters as described herein. This process is particularly well suited to use as a test wafer during a plasma process but may also be used in other circumstances. To instrument processes in a particular chamber, a test wafer is often used. The test wafer has a top surface with a hundred or more thermal sensors coupled to memory cells. The test wafer is attached a carrier while a process is being run and the test wafer logs temperature at each thermal sensor during the process. After the process, the test wafer is removed and the temperature logs are read. The process may then be adjusted based on the temperature data.

The process of FIG. 4 collects similar data using a heated carrier with a passive wafer on top. The heaters are used to collect the temperature data without the need for a test wafer. The temperature of the wafer may be estimated based on the temperature of the carrier immediately below the carrier. For such a test, the heating elements are not used for heating bur only for measuring temperature. In contrast to the test wafer, the process of FIG. 4 allows temperature data to be collected in real time or during the process rather than waiting until the end of the process. This allows the test process to be modified during the test to obtain the desired results more quickly.

At 60 the voltage supplied to all of the resistive heating elements is measured. This is normally the primary power supply voltage that is supplied to all of the resistive heating elements. The current at 62 will be zero or negligible because the carrier is not being used to add heat to the test process. At 64 a particular single one i of the heating elements is selected as the start of the process and power is applied. This will be a known power selected to provide the best temperature measurement. As explained below a higher current will typically provide a higher response to temperature. With the one powered heating element, the current load is measured at 66. This current is almost completely due to the selected heating element. The selected heating element may then be returned to OFF, the normal state for this cycle.

At 68 the difference between the first and second combined current loads is determined. This subtracts out noise, current leakage and other factors that move the OFF state current away from zero. At 70 the temperature of the selected heating element is determined using these differences.

At 72 another heating element is selected and the process is repeated until all of the heating elements are measured. That is the end of this measurement cycle. As with FIGS. 1-3, the process may be completed through all of the heating elements for as long as desired. This provides a continuous temperature map over time.

Figure 5:
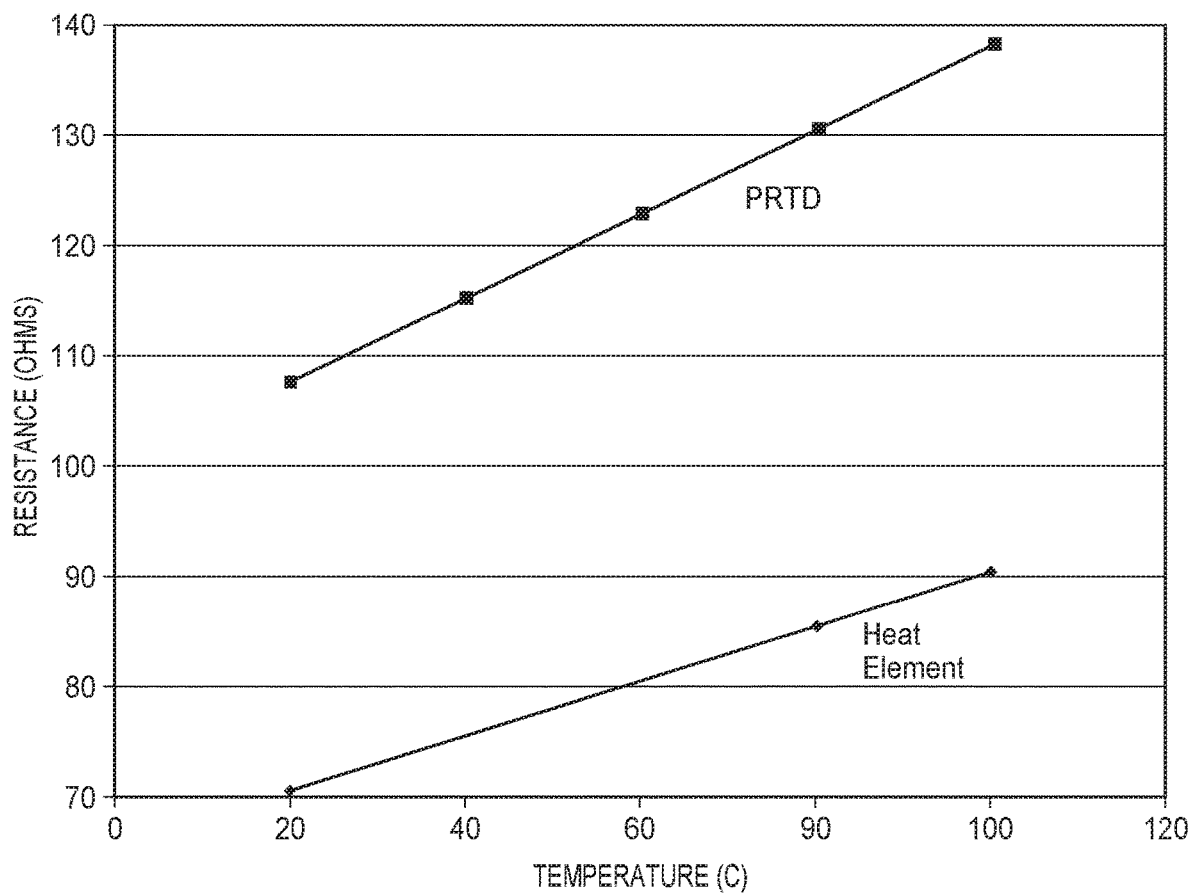
FIG. 5 is a graph of resistance over temperature of an electrical response characteristic of a thermal device and a heating element according to an embodiment.

FIG. 5 is a graph of an electrical response characteristic of a typical commercial resistive thermal device and of a typical commercial heating element for comparison. The vertical scale shows the resistance of the component and the horizontal scale shows the temperature of the component. The upper line corresponds to a resistive thermal device designed specifically for measuring temperature by changing resistance. As shown at room temperature of about 20° C., the resistance is about 108Ω. This increases to almost 140Ω, at 100° C. As shown, the response of the thermal device within the illustrated temperature range is approximately linear. This allows temperatures to be easily and quickly determined based on the measured resistance.

The response of a heating element is shown on the lower line. This line is also approximately linear but with a lower slope. As a result the temperature measurement is less accurate. This is a result of the thermal device being specifically designed to exhibit a large change in response to temperature. The heating element is designed to efficiently convert current to heat. With modifications, the response of the heating element may be improved. In this example, at room temperature the heating element has a resistance of about 70Ω. At 100° C., the resistance has increased to about 90Ω. While the thermal device shows a change of about 30Ω between the two temperatures, the heating element shows a change of only about 20Ω through the same temperature.

Figure 6:
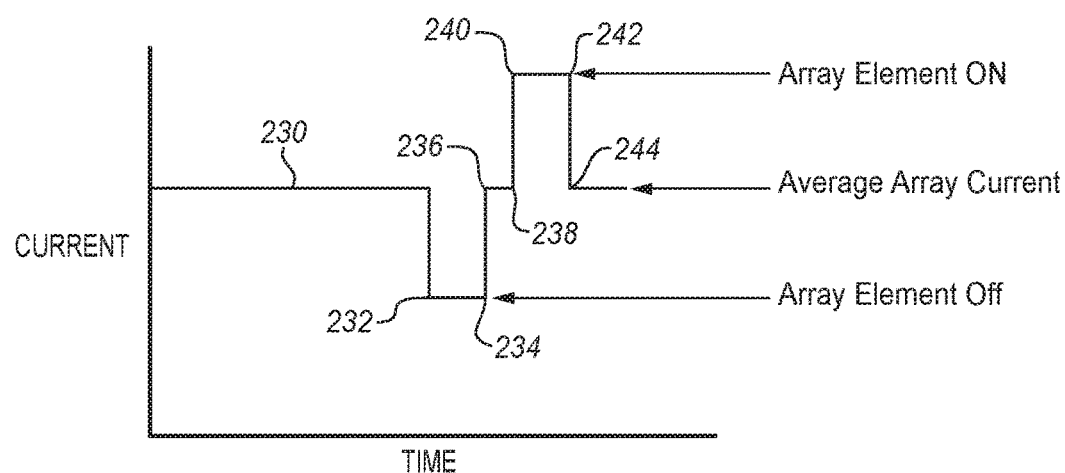
FIG. 6 is a graph of current over time of power from a carrier power supply according to an embodiment.

FIG. 6 is a graph of current over time from a substrate carrier power supply as heating elements are turned on and off. This shows how the additive and subtractive techniques described above may be used. The graph shows different current levels from a common main power supply as the state of various heating elements is changed. The first state 230 corresponds to an average current or power when most of the heating elements are powered. At 232 one or more heating elements are switched from ON to OFF. This results in a reduction in the total current. At 234 the low current stage is ended and at 236 the heating elements are returned to an ON state. The difference between the current at 234 and at 236 may be used to determine the current consumed by the heating elements that were turned from ON to OFF. This may then be used to determine the temperature in the vicinity of those heating elements.

In a similar way the current at 238 reflects an average or normal power and at 240 a second set of one or more heating elements are switched from an OFF to an ON state. This increases the total current. At 242 the ON cycle ends and at 244 the heating elements are returned to an OFF state. The difference between the current at 242 and 244 may be used to determine the current draw and with it the temperature in the vicinity of the second set of heating elements. The shape of curve is shown as rectangular in order to simplify the drawing figure. In a real system there will be settling time after each change as the heating elements and the power supply adjust to the change in state. The response of the heating elements and of the power supply will not be immediate and direct as shown.

Figure 7:
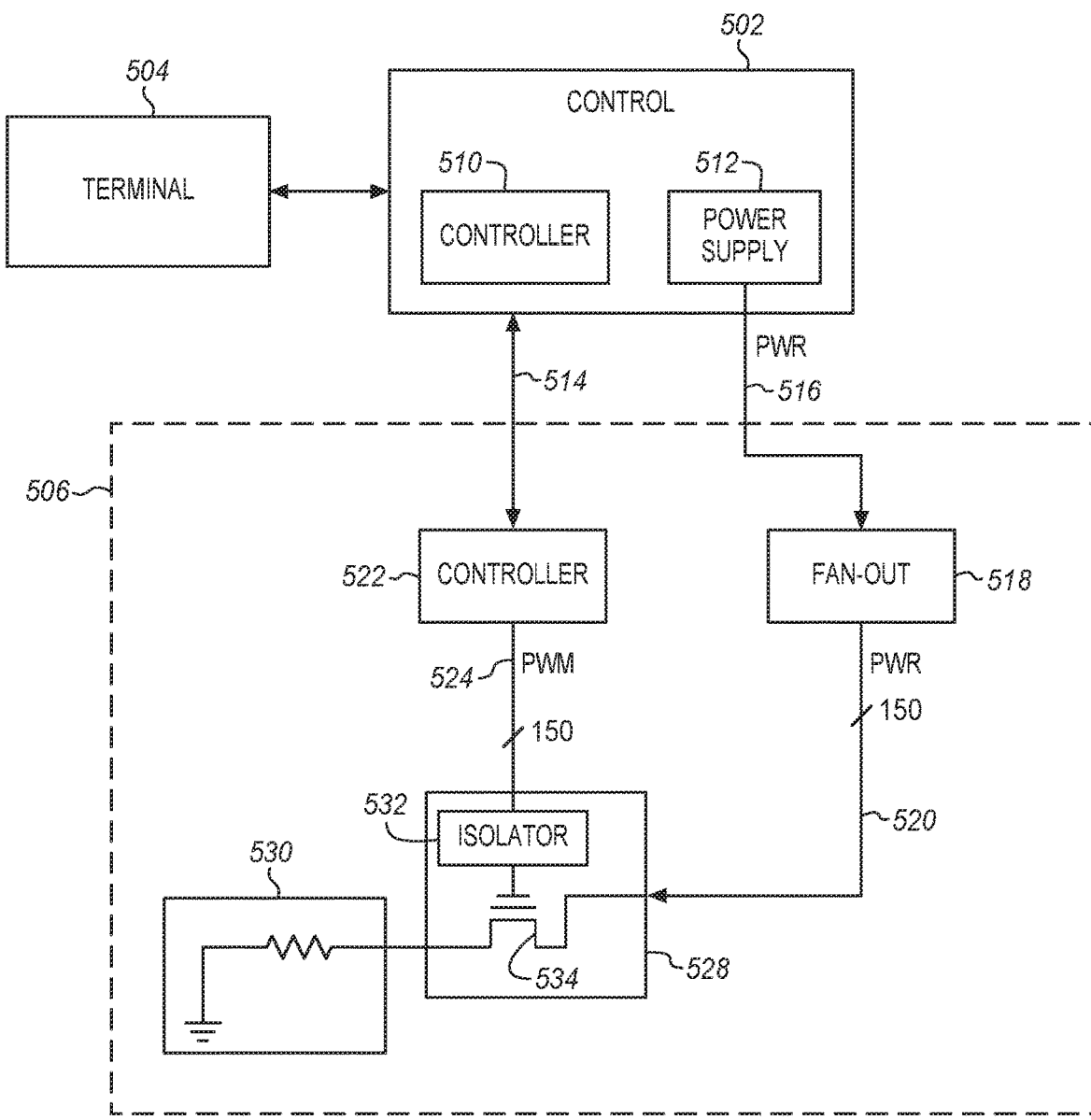
FIG. 7 is a diagram of a control box coupled to a heated substrate carrier according to an embodiment.

FIG. 7 is a block diagram of a substrate carrier and a temperature control system suitable for use with the method described above. The system has a control box 502 that is coupled to a terminal 504. The terminal may be in the form of a conventional computer that runs process control or temperature control software with a user interface to allow an operator to control the machine processes. The terminal may have a processor coupled to a mass storage medium, a user interface and an interface to the control box. The terminal may have other components such as high speed memory, wireless or wired communications interfaces, additional processors, etc. The mass storage may be in the form of a machine-readable medium having instructions, parameters, and various logs, in solid state, optical, or magnetic storage. The control box controls the operation of the substrate carrier 506 in response to instructions or commands from the terminal. The control box may be able to operate autonomously subject to general commands from the terminal. The control box may control other functions of the carrier such as clamp electrodes, coolants, gas injection, and other functions not shown here in order not to obscure the features of temperature measurement shown here.

The control box includes a heating element power controller 510 and a power supply 512. The power supply provides a single power feed 516 on a single line to a fan-out distributor 518 within the substrate carrier 506. The fan-out distributor supplies the power from the power supply 512 to all of the heating elements 530 of the carrier 506. This power may be significant depending on the implementation. In the illustrated embodiment there are 150 heating elements each capable of drawing 10 watts, so the power supply provides 1500 watts to the carrier. The voltage, current, and other parameters are measured and controlled by the power supply 512 in the control box.

The power controller of the control box sends control signals through a data interface 514 to a carrier controller 522 of the carrier 506. The control signals may be used to adjust the power supplied to each of the heating elements 530, change from an ON state to an OFF state and to adjust other parameters of the carrier. In this example, the data signals set the parameters of operation of each of the heaters based on information from the terminal or generated within the control box power controller. The control signal 514 may be a sequence of packets where each packet sets parameters for a different one of the heating elements. Packet headers or identification fields might be used to identify a particular one of the heating elements so that the status of a particular heating element may be changed with any packet and before it might have a turn in an ordered sequence of packets.

In this example, the carrier controller receives the status update packets for each heating element and generates a different PWM (Pulse Width Modulated) analog signal to each of the heating elements. To set a particular heater to an OFF state, the PWM signal is a zero duty cycle signal or a low signal. To set different amounts of heating, the controller adjusts the duty cycle of the respective PWM signal for each heating element. This allows each heating element to be independently controlled using a unique signal to that element. In this example there are 150 unique individual PWM connections, one for each heating element. The PWM signals are generated by the carrier controller and received at a power interface for each heating element. The unique signals from the carrier controller may be very simple so that they are only an on/off cycle of an optical signal indicating the duty cycle of the PWM pulses. These may be converted directly into a gate driver of an amplifier to the respective heating element.

At each respective heating element 530, there is a power interface 528 and the actual resistive heating element 530. The power interface receives the PWM signal at an isolator 532 such as an opto-isolator and applies the PWM signal to an amplifier. The amplifier receives power 520 from the fan-out distributor and modulates the received power based on the PWM signal. The modulated power is applied to the resistive heater 530 to heat the carrier and therefore to heat the substrate. The optical signal is used within the carrier to shield the sensitive signal from noise within the carrier. The plasma, bias power, active ions and other aspects of a plasma chamber may interfere with an electrical signal and especially an analog electrical signal.

Using this system, the terminal 504 may be used to initiate a temperature measurement cycle. Alternatively, the control box 510 may operate a temperature measurement cycle. The control box will send control signals 514 to the carrier controller 522 to set the duty cycles of particular ones of the heating elements to zero and then back again to normal in a particular order and with a particular timing as described in FIGS. 1-4. The power supply will monitor the changes in current draw from the heaters as each heater is turned on and off throughout the carrier. This temperature information may be used to increase or decrease the duty cycle applied to each heater or to provide metrics on a particular process. Each heating element may be switched from ON or OFF in microseconds and a change in heating requires a few seconds to cause a new stable temperature at the carrier. For a process that takes a few minutes, the temperature may be measured many times through the process.

Using 150 heaters provides very specific information about a small area of the carrier. More or fewer heaters may be used, depending on the desired precision. In addition, since each heating element is individually controlled, the controller may test the temperature only at some of the heaters. Instead of 150 different temperature locations, the controller may use only 50 different locations by measuring the temperature at only 50 of the available heaters. While 150 heating elements are suggested, there may be more or fewer depending on the desired precision. There may also be other heaters such as a few larger high power heaters to provide more heating with a coarse level of control. The coarse level of control may then be adjusted using the many smaller heaters. While in this example each heater is controlled individually, several heaters may be connected to a single PWM input and amplifier 528 so that a group of heaters are controlled as a group.

Figure 8:
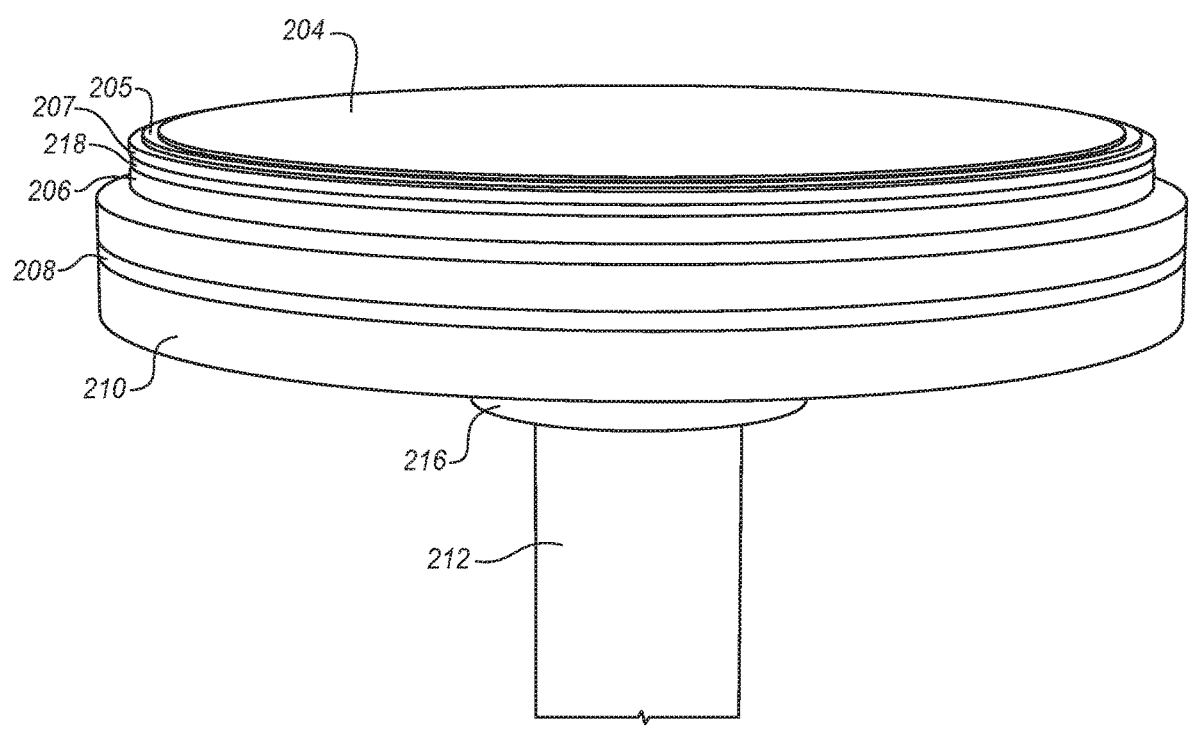
FIG. 8 is an isometric view of an electrostatic chuck in accordance with an embodiment of the invention.

FIG. 8 is an isometric view of an assembled electrostatic chuck. A support shaft 212 supports a base plate 210 through an isolator 216. A middle isolator plate 208 and an upper cooling plate 206 are carried by the base plate. The top cooling plate 206 carries a dielectric puck 205 on the top surface of the heater plate. The puck has an upper circular platform to support a workpiece 204 and a lower concentric circular base 207 to attach to the heater plate. The upper platform has internal electrodes to electrostatically attach the workpiece. The workpiece may alternately be clamped, vacuumed or attached in another way.

There is an adhesive bond 218 between the puck 215 and the top cooling plate 206 to hold the ceramic of the top plate to the metal of the cooling plate. Heaters may be formed in the top plate or the middle heater plate. In such an embodiment, the middle plate performs other functions but is no longer the location of the heaters. The carrier controller may be attached to the cooling plate or to any other location. The resistive heating elements and associated power interface may be embedded into the ceramic of the puck. This places the heaters as close as possible to the substrate on the top plate for the greatest effect.

The ESC is able to control the temperature of the workpiece using resistive heaters in the puck as described above. In addition, coolant fluid may be used in the cooling plate. Electrical power, control signals, coolant, gases, etc. are supplied to the coolant plate 206 and the puck 205 through the support shaft 212. The ESC may also be manipulated and held in place using the support shaft.

Figure 9:
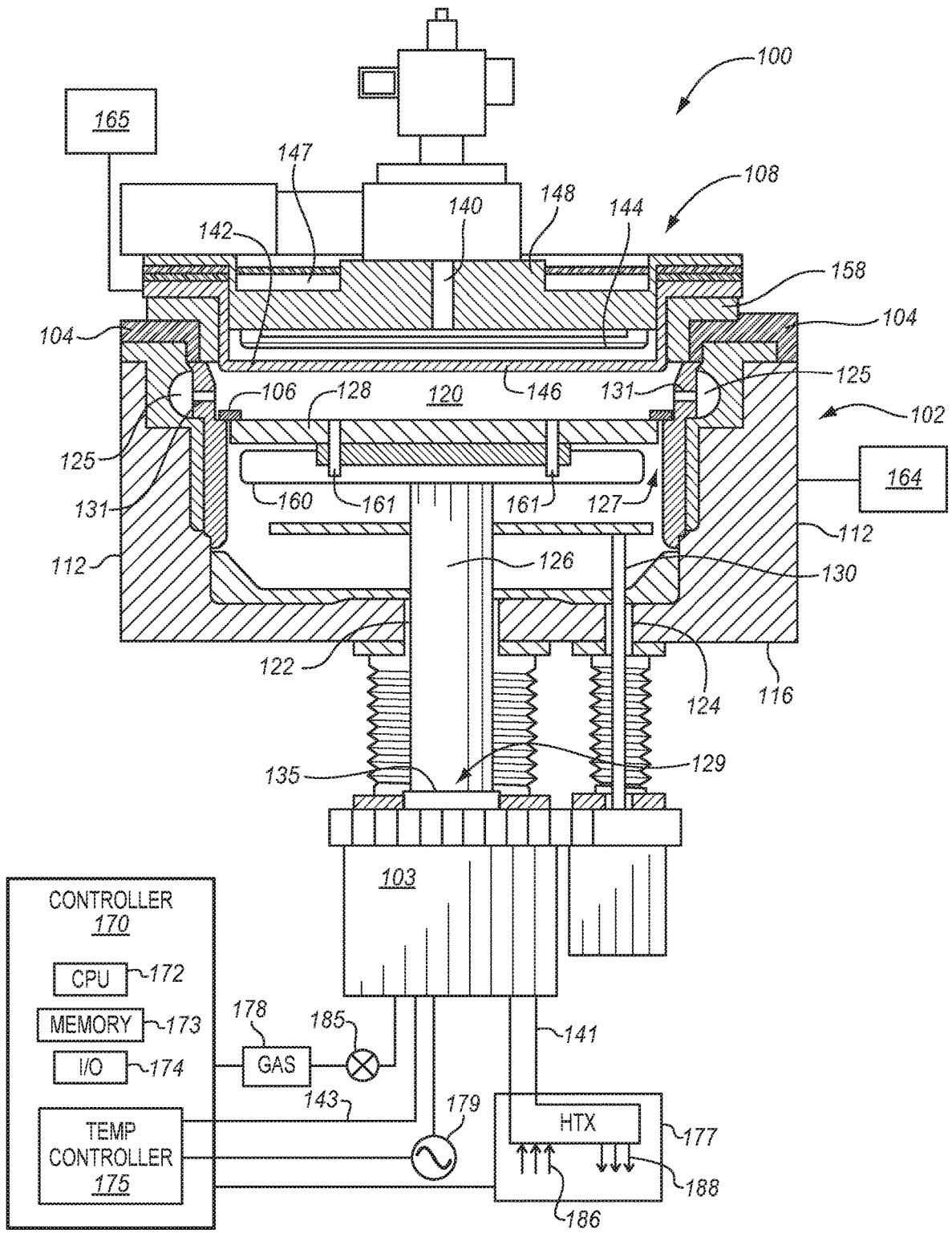
FIG. 9 is a schematic of a plasma etch system including a chuck assembly in accordance with an embodiment of the present invention.

FIG. 9 is a partial cross sectional view of a plasma system 100 having a pedestal 128 according to embodiments described herein. The pedestal 128 has an active cooling system which allows for active control of the temperature of a substrate positioned on the pedestal over a wide temperature range while the substrate is subjected to numerous process and chamber conditions. The plasma system 100 includes a processing chamber body 102 having sidewalls 112 and a bottom wall 116 defining a processing region 120.

A pedestal, carrier, chuck or ESC 128 is disposed in the processing region 120 through a passage 122 formed in the bottom wall 116 in the system 100. The pedestal 128 is adapted to support a substrate (not shown) on its upper surface. The substrate may be any of a variety of different workpieces for the processing applied by the chamber 100 made of any of a variety of different materials. The pedestal 128 may optionally include heating elements (not shown), for example resistive elements, to heat and control the substrate temperature at a desired process temperature. Alternatively, the pedestal 128 may be heated by a remote heating element, such as a lamp assembly.

The pedestal 128 is coupled by a shaft 126 to a power outlet or power box 103, which may include a drive system that controls the elevation and movement of the pedestal 128 within the processing region 120. The shaft 126 also contains electrical power interfaces to provide electrical power to the pedestal 128. The power box 103 also includes interfaces for electrical power and temperature indicators, such as a thermocouple interface. The shaft 126 also includes a base assembly 129 adapted to detachably couple to the power box 103. A circumferential ring 135 is shown above the power box 103. In one embodiment, the circumferential ring 135 is a shoulder adapted as a mechanical stop or land configured to provide a mechanical interface between the base assembly 129 and the upper surface of the power box 103.

A rod 130 is disposed through a passage 124 formed in the bottom wall 116 and is used to activate substrate lift pins 161 disposed through the pedestal 128. The substrate lift pins 161 lift the workpiece off the pedestal top surface to allow the workpiece to be removed and taken in and out of the chamber, typically using a robot (not shown) through a substrate transfer port 160.

A chamber lid 104 is coupled to a top portion of the chamber body 102. The lid 104 accommodates one or more gas distribution systems 108 coupled thereto. The gas distribution system 108 includes a gas inlet passage 140 which delivers reactant and cleaning gases through a showerhead assembly 142 into the processing region 120B. The showerhead assembly 142 includes an annular base plate 148 having a blocker plate 144 disposed intermediate to a faceplate 146.

A radio frequency (RF) source 165 is coupled to the showerhead assembly 142. The RF source 165 powers the showerhead assembly 142 to facilitate generation of plasma between the faceplate 146 of the showerhead assembly 142 and the heated pedestal 128. In one embodiment, the RF source 165 may be a high frequency radio frequency (HFRF) power source, such as a 13.56 MHz RF generator. In another embodiment, RF source 165 may include a HFRF power source and a low frequency radio frequency (LFRF) power source, such as a 300 kHz RF generator. Alternatively, the RF source may be coupled to other portions of the processing chamber body 102, such as the pedestal 128, to facilitate plasma generation. A dielectric isolator 158 is disposed between the lid 104 and showerhead assembly 142 to prevent conducting RF power to the lid 104. A shadow ring 106 may be disposed on the periphery of the pedestal 128 that engages the substrate at a desired elevation of the pedestal 128.

Optionally, a cooling channel 147 is formed in the annular base plate 148 of the gas distribution system 108 to cool the annular base plate 148 during operation. A heat transfer fluid, such as water, ethylene glycol, a gas, or the like, may be circulated through the cooling channel 147 such that the base plate 148 is maintained at a predefined temperature.

A chamber liner assembly 127 is disposed within the processing region 120 in very close proximity to the sidewalls 101, 112 of the chamber body 102 to prevent exposure of the sidewalls 101, 112 to the processing environment within the processing region 120. The liner assembly 127 includes a circumferential pumping cavity 125 that is coupled to a pumping system 164 configured to exhaust gases and byproducts from the processing region 120 and control the pressure within the processing region 120. A plurality of exhaust ports 131 may be formed on the chamber liner assembly 127. The exhaust ports 131 are configured to allow the flow of gases from the processing region 120 to the circumferential pumping cavity 125 in a manner that promotes processing within the system 100.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The system controller 170 also includes a central processing unit 172, memory 173 and input/output interface 174. The temperature controller receives a temperature reading 143 from a sensor (not shown) on the pedestal. The temperature sensor may be proximate a coolant channel, proximate the wafer, or placed in the dielectric material of the pedestal. The temperature controller 175 uses the sensed temperature or temperatures to output control signals affecting the rate of heat transfer between the pedestal assembly 142 and a heat source and/or heat sink external to the plasma chamber 105, such as a heat exchanger 177.

The system may also include a controlled heat transfer fluid loop 141 with flow controlled based on the temperature feedback loop. In the example embodiment, the temperature controller 175 is coupled to a heat exchanger (HTX)/chiller 177. Heat transfer fluid flows through a valve (not shown) at a rate controlled by the valve through the heat transfer fluid loop 141. The valve may be incorporate into the heat exchanger or into a pump inside or outside of the heat exchanger to control the flow rate of the thermal fluid. The heat transfer fluid flows through conduits in the pedestal assembly 142 and then returns to the HTX 177. The temperature of the heat transfer fluid is increased or decreased by the HTX and then the fluid is returned through the loop back to the pedestal assembly.

The HTX includes a heater 186 to heat the heat transfer fluid and thereby heat the substrate. The heater may be formed using resistive coils around a pipe within the heat exchanger or with a heat exchanger in which a heated fluid conducts heat through an exchanger to a conduit containing the thermal fluid. The HTX also includes a cooler 188 which draws heat from the thermal fluid. This may be done using a radiator to dump heat into the ambient air or into a coolant fluid or in any of a variety of other ways. The heater and the cooler may be combined so that a temperature controlled fluid is first heated or cooled and then the heat of the control fluid is exchanged with that of the thermal fluid in the heat transfer fluid loop.

The valve (or other flow control devices) between the HTX 177 and fluid conduits in the pedestal assembly 142 may be controlled by the temperature controller 175 to control a rate of flow of the heat transfer fluid to the fluid loop. The temperature controller 175, the temperature sensor, and the valve may be combined in order to simplify construction and operation. In embodiments, the heat exchanger senses the temperature of the heat transfer fluid after it returns from the fluid conduit and either heats or cools the heat transfer fluid based on the temperature of the fluid and the desired temperature for the operational state of the chamber 102.

Electric heaters (not shown) are used in the ESC to apply heat to the workpiece assembly. The electric heaters in the form of resistive elements are coupled to a power supply 179 that is controlled by the temperature control system 175 to energize the heater elements to obtain a desired temperature.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluid such as those containing perfluorinated inert polyethers. While the present description describes the pedestal in the context of a PECVD processing chamber, the pedestal described herein may be used in a variety of different chambers and for a variety of different processes.

A backside gas source 178 such as a pressurized gas supply or a pump and gas reservoir are coupled to the chuck assembly 142 through a mass flow meter 185 or other type of valve. The backside gas may be helium, argon, or any gas that provides heat convection between the wafer and the puck without affecting the processes of the chamber. The gas source pumps gas through a gas outlet of the pedestal assembly described in more detail below to the back side of the wafer under the control of the system controller 170 to which the system is connected.

The processing system 100 may also include other systems, not specifically shown in FIG. 4, such as plasma sources, vacuum pump systems, access doors, micromachining, laser systems, and automated handling systems, inter alia. The illustrated chamber is provided as an example and any of a variety of other chambers may be used with the present invention, depending on the nature of the workpiece and desired processes. The described pedestal and thermal fluid control system may be adapted for use with different physical chambers and processes.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method to determine a temperature profile of a substrate attached to a carrier during processing, the method comprising:
   (a) measuring a first combined current load of a plurality of heating elements in the carrier, wherein the measuring a first combined current load comprises measuring when the plurality of heating elements are each in an ON state except for a first heating element of the plurality of heating elements;
   (b) changing a power status of the first heating element of the plurality of heating elements, wherein changing a power status comprises changing the first heating element to an ON state;
   (c) measuring a second combined current load of the plurality of heating elements after changing the power status of the first heating element;
   (d) determining the difference between the first and second combined current loads;
   (e) determining a temperature of the first heating element using the difference; and
   (f) reverting the power status of the first heating element to that before (b) and repeating (b), (c), and (d) for each of the other heating elements of the plurality of heating elements; and
   (g) determining a temperature for each of the other heating elements of the plurality of heating elements.

2. The method of claim 1, further comprising measuring a first combined voltage load of the plurality of heating elements in the carrier and wherein determining a temperature comprises using the first combined voltage.

3. The method of claim 1, further comprising determining a resistance using the combined current loads difference and wherein determining a temperature comprises determining a temperature using the determined resistance.

4. The method of claim 3, wherein determining a temperature comprises applying a linear factor to the determined resistance.

5. The method of claim 1, wherein changing a power status further comprises changing a power status of a subset of the plurality of heating element and wherein determining a temperature comprises distributing the combined current loads difference among the heating elements of the subset and determining a temperature using the distributed current loads difference.

6. The method of claim 1, wherein changing a power status of the first heating element comprises sending a pulse width modulated signal with a zero duty cycle to the first heating element.

7. The method of claim 1, further comprising powering each of the plurality of heating elements before measuring the first combined current load and wherein changing the power status of the first heating element comprises removing power from the first heating element.

8. A machine-readable medium having instructions thereon that when operated on by the machine cause the machine to perform operations comprising:
   (a) measuring a first combined current load of a plurality of heating elements in the carrier, wherein the measuring a first combined current load comprises measuring when the plurality of heating elements are each in an ON state except for a first heating element of the plurality of heating elements;
   (b) changing a power status of the first heating element of the plurality of heating elements, wherein changing a power status comprises changing the first heating element to an ON state;
   (c) measuring a second combined current load of the plurality of heating elements after changing the power status of the first heating element;
   (d) determining the difference between the first and second combined current loads;
   (e) determining a temperature of the first heating element using the difference; and
   (f) reverting the power status of the first heating element to that before (b) and repeating (b), (c), and (d) for each of the other heating elements of the plurality of heating elements; and
   (g) determining a temperature for each of the other heating elements of the plurality of heating elements.

9. The medium of claim 8, the operations further comprising measuring a first combined voltage load of the plurality of heating elements in the carrier and wherein determining a temperature comprises using the first combined voltage.

10. The medium of claim 8, the operations further comprising determining a resistance using the combined current loads difference and wherein determining a temperature comprises determining a temperature using the determined resistance.

11. The medium of claim 10, wherein determining a temperature comprises applying a linear factor to the determined resistance.

12. The medium of claim 8, wherein changing a power status further comprises changing a power status of a subset of the plurality of heating element and wherein determining a temperature comprises distributing the combined current loads difference among the heating elements of the subset and determining a temperature using the distributed current loads difference.

13. The medium of claim 8, wherein changing a power status of the first heating element comprises sending a pulse width modulated signal with a zero duty cycle to the first heating element.

14. The medium of claim 8 the operations further comprising powering each of the plurality of heating elements before measuring the first combined current load and wherein changing the power status of the first heating element comprises removing power from the first heating element.

* * * * *